(12) United States Patent
Li et al.

(10) Patent No.: US 11,721,705 B1
(45) Date of Patent: Aug. 8, 2023

(54) ARRAY SUBSTRATE AND METHOD FOR MANUFACTURING THE SAME, AND DISPLAY PANEL

(71) Applicants: Mianyang HKC Optoelectronics Technology Co., Ltd., Sichuan (CN); HKC Corporation Limited, Guangdong (CN)

(72) Inventors: Zhiwei Li, Sichuan (CN); Baohong Kang, Sichuan (CN)

(73) Assignees: MIANYANG HKC OPTOELECTRONICS TECHNOLOGY CO., LTD., Sichuan (CN); HKC CORPORATION LIMITED, Guangdong (CN)

( * ) Notice: Subject to any disclaimer, the term of this patent is extended or adjusted under 35 U.S.C. 154(b) by 0 days.

(21) Appl. No.: 18/089,722

(22) Filed: Dec. 28, 2022

(30) Foreign Application Priority Data

Jan. 21, 2022 (CN) .......................... 202210072612.6

(51) Int. Cl.
  *H01L 27/12* (2006.01)
  *G02F 1/1362* (2006.01)

(52) U.S. Cl.
  CPC ...... *H01L 27/124* (2013.01); *G02F 1/136222* (2021.01); *G02F 1/136295* (2021.01); *H01L 27/1262* (2013.01)

(58) Field of Classification Search
  CPC ......... G02F 1/136295; G02F 1/136286; G02F 1/134372; G02F 1/134363; G02F 1/136213; G02F 2201/121; H01L 27/124
  See application file for complete search history.

(56) References Cited

U.S. PATENT DOCUMENTS

2017/0192580 A1\* 7/2017 Jung ................. G02F 1/134309
2018/0012948 A1  1/2018 Lee

FOREIGN PATENT DOCUMENTS

| CN | 101517472 A | 8/2009 |
| CN | 102967971 A | 3/2013 |

(Continued)

OTHER PUBLICATIONS

International Search Report dated Feb. 24, 2023 received in International Application No. PCT/CN2022/141290.

*Primary Examiner* — Angela K Davison
(74) *Attorney, Agent, or Firm* — Scully, Scott, Murphy & Presser, P.C.

(57) ABSTRACT

An array substrate and a method for manufacturing the same, a display panel, and a display device are provided. The array substrate includes a base substrate, a stacked structure, a common-electrode line, and a conductive structure. The stacked structure is disposed on a first surface of the substrate. The stacked structure includes a contact pad, a common-electrode layer, and a gate line. The contact pad is disposed on the first surface of the base substrate. The base substrate defines a first via hole at a position corresponding to the contact pad. The common-electrode layer is connected with the contact pad. The common-electrode line is disposed on a second surface of the base substrate. An orthographic projection of the gate line on a plane where the common-electrode line is located at least partially overlaps with the common-electrode line. The conductive structure is connected with the contact pad and the common-electrode line.

20 Claims, 7 Drawing Sheets

(56) References Cited

FOREIGN PATENT DOCUMENTS

| CN | 103474436 A | 12/2013 |
|---|---|---|
| CN | 103499906 A | 1/2014 |
| CN | 105161495 A | 12/2015 |
| CN | 110412806 A | 11/2019 |
| CN | 111128025 A | 5/2020 |

\* cited by examiner

RELATED ART

ARRAY SUBSTRATE AND METHOD FOR MANUFACTURING THE SAME, AND DISPLAY PANEL

CROSS-REFERENCE TO RELATED APPLICATIONS

This application claims priority under 35 U.S.C. § 119(a) to Chinese Patent Application No. 202210072612.6, filed Jan. 21, 2022, the entire disclosure of which is incorporated herein by reference.

TECHNICAL FIELD

This application relates to the field of display panel, and particularly to an array substrate and a method for manufacturing the same, and a display panel.

BACKGROUND

With development and progress of technologies, Thin Film Transistor Liquid Crystal Displays (TFT-LCD) have become the most widely used display in the market, especially in LCD TVs.

At present, the TFT-LCD includes a Data Line (DL)/source line, a Scan Line (SL)/gate line, a common-electrode line, and a thin film transistor (TFT). In an existing TFT-LCD, the SL is perpendicular to DL, and the common-electrode line is parallel to and spaced apart from the SL. Since signals transmitted on various signal lines are different, these signal lines need to be isolated from one another, and these signal lines are opaque since they are made of metal, as a result, an aperture ratio of a pixel is relatively low, which leads to a low display brightness of the display panel.

SUMMARY

The disclosure provides an array substrate. The array substrate includes a base substrate, a stacked structure, a common-electrode line, and a conductive structure. The base substrate has a first surface and a second surface opposite to the first surface. The stacked structure is disposed on the first surface of the substrate. The stacked structure includes a contact pad, a common-electrode layer, and a gate line. The contact pad is disposed on the first surface of the base substrate. The base substrate defines a first via hole at a position corresponding to the contact pad, where the first via hole penetrates the first surface and the second surface of the base substrate. The common-electrode layer is connected with the contact pad. The gate line is isolated from the common-electrode layer and the contact pad. The common-electrode line is disposed on the second surface of the base substrate, where an orthographic projection of the gate line on a plane where the common-electrode line is located at least partially overlaps with the common-electrode line. The conductive structure is connected with the contact pad, and connected to the common-electrode line through the first via hole.

The disclosure further provides a display panel. The display panel includes a color-film substrate and the above array substrate. The array substrate is opposite to the color-film substrate.

Figure 1:
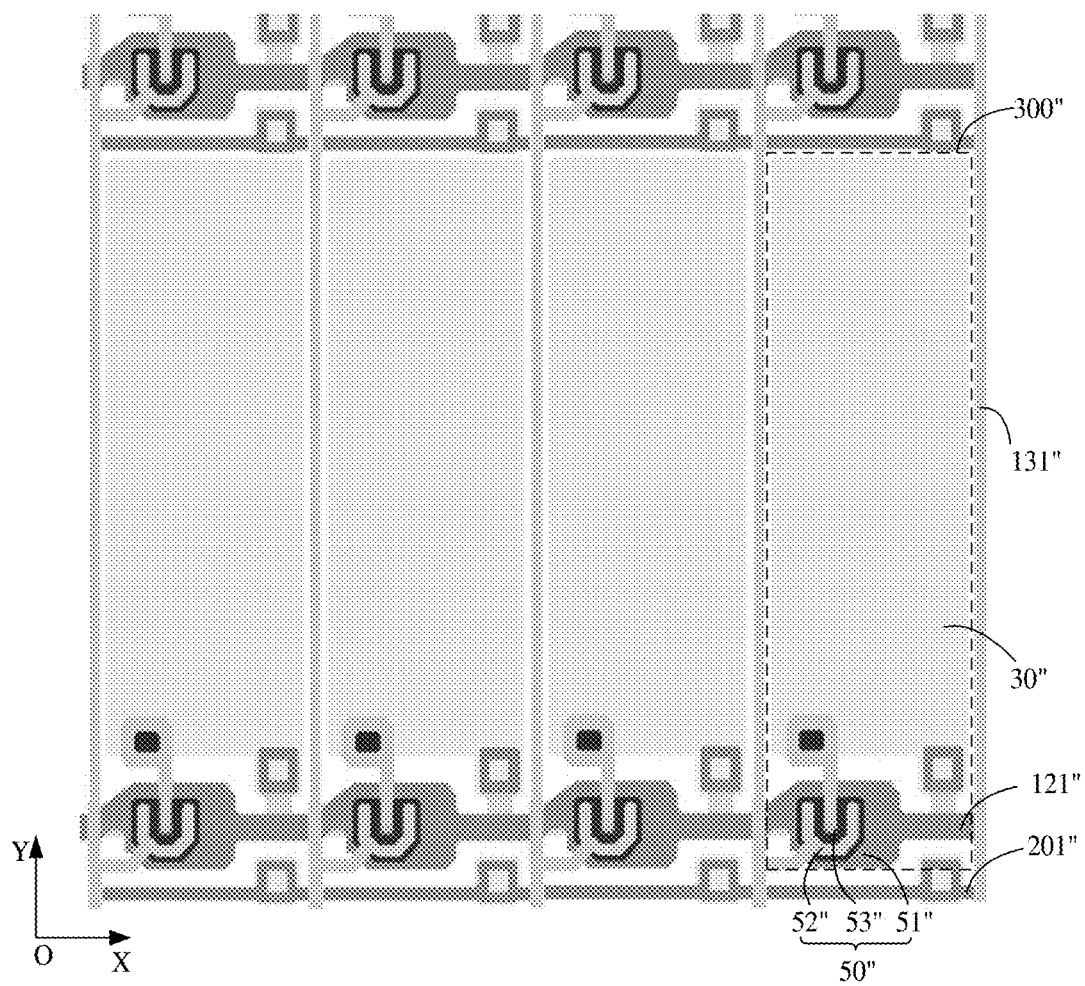
FIG. 1 is a schematic top view of an existing array substrate.

The disclosure will be further depicted below with reference to specific implementations and accompanying drawings.

DETAILED DESCRIPTION

Hereinafter, technical solutions of implementations of the disclosure will be depicted in a clear and comprehensive manner with reference to accompanying drawings intended for these implementations. Apparently, implementations described below merely illustrate some implementations, rather than all implementations, of the disclosure. All other implementations obtained by those of ordinary skill in the art based on the implementations of the disclosure without creative efforts shall fall within the protection scope of the disclosure.

In description of the disclosure, it should be noted that, orientations or positional relationships indicated by the terms "upper", "lower", "left", "right", and the like are based on orientations or positional relationships illustrated in the accompanying drawings, and are only for convenience of describing the disclosure and simplifying the description, rather than indicating or implying that the referred device or element must have a specific orientation, be constructed and operated in a specific orientation, and therefore should not be construed as a limitation of the disclosure. In addition, the terms "first", "second", and the like are used for descriptive only and should not be construed to indicate or imply relative importance.

In view of this, the disclosure provides an array substrate and a method for manufacturing the same, a display panel, and a display device, which aims to solve a problem of a low aperture ratio of a pixel in an existing Thin Film Transistor Liquid Crystal Display (TFT-LCD).

The disclosure provides an array substrate. The array substrate includes a base substrate, a stacked structure, a common-electrode line, and a conductive structure. The base substrate has a first surface and a second surface opposite to the first surface. The stacked structure is disposed on the first surface of the substrate. The stacked structure includes a contact pad, a common-electrode layer, and a gate line. The contact pad is disposed on the first surface of the base substrate. The base substrate defines a first via hole at a position corresponding to the contact pad, where the first via hole penetrates the first surface and the second surface of the base substrate. The common-electrode layer is connected with the contact pad. The gate line is isolated from the common-electrode layer and the contact pad. The common-electrode line is disposed on the second surface of the base substrate, where an orthographic projection of the gate line on a plane where the common-electrode line is located at least partially overlaps with the common-electrode line. The conductive structure is connected with the contact pad, and connected to the common-electrode line through the first via hole.

According to the array substrate of the disclosure, the gate line is disposed on the first surface of the array substrate and the common-electrode line is disposed on the second surface of the array substrate opposite to the first surface, and the gate line at least partially overlaps with the common-electrode line, which can reduce a wiring area on the first surface of the array substrate, thereby increasing an area of a pixel-electrode layer in each pixel unit and increasing an aperture ratio of the pixel unit.

Optionally, the gate line and the contact pad of the stacked structure are disposed in a same layer, and are disposed on the first surface of the base substrate. The stacked structure further includes a first insulating layer and a second insulating layer. The first insulating layer covers the gate line and the contact pad. The second insulating layer is disposed on the first insulating layer. The common-electrode layer is disposed on the second insulating layer. The first insulating layer and the second insulating layer define a second via hole at positions corresponding to the contact pad. The common-electrode layer is connected with the contact pad through the second via hole.

Optionally, the stacked structure further includes a first insulating layer, a second insulating layer, a third insulating layer, a gate, a source, a drain, an active layer, and a pixel-electrode layer. The gate line, the contact pad, and the gate are disposed on the first surface of the base substrate. The first insulating layer covers the gate line, the contact pad, and the gate. The source, the drain, and the active layer are disposed on the first insulating layer. The second insulating layer covers the source, the drain, and the active layer. The common-electrode layer is disposed on the second insulating layer, where the first insulating layer and the second insulating layer define a second via hole at positions corresponding to the contact pad, and the common-electrode layer is connected with the contact pad through the second via hole. The third insulating layer covers the common-electrode layer. The pixel-electrode layer is disposed on the third insulating layer.

Optionally, an orthographic projection of the pixel-electrode layer on the base substrate overlaps with an orthographic projection of the common-electrode layer on the base substrate.

Optionally, the common-electrode layer and the contact pad of the stacked structure are disposed in a same layer, and are disposed on the first surface of the base substrate. The stacked structure further includes a first insulating layer. The first insulating layer covers the common-electrode layer and the contact pad. The gate line is disposed on the first insulating layer.

Optionally, the stacked structure further includes a first insulating layer, a second insulating layer, a third insulating layer, a gate, a source, a drain, an active layer, and a pixel-electrode layer. The common-electrode layer and the contact pad are disposed on the first surface of the base substrate. The first insulating layer covers the common-electrode layer and the contact pad. The gate line and the gate are disposed on the first insulating layer. The second insulating layer covers the gate line and the gate. The source, the drain, and the active layer are disposed on the second insulating layer. The third insulating layer covers the source, the drain, and the active layer. The pixel-electrode layer is disposed on the third insulating layer.

Optionally, the orthographic projection of the gate line on the plane where the common-electrode line is located completely covers the common-electrode line. Alternatively, an orthographic projection of the common-electrode line on a plane where the gate line is located completely covers the gate line.

Optionally, the base substrate is made of glass or polyimide.

The disclosure further provides a method for manufacturing an array substrate. The method includes the following. A base substrate is provided, where the base substrate has a first surface and a second surface opposite to the first surface. A stacked structure is formed on the first surface of the base substrate, where the stacked structure includes a contact pad, a common-electrode layer, and a gate line, the contact pad is formed on the first surface of the base substrate, the common-electrode layer is connected with the contact pad, and the gate line is isolated from the common-electrode layer and the contact pad. A first via hole is formed in the base substrate at a position corresponding to the contact pad, where the first via hole penetrates the first surface and the second surface of the base substrate. A common-electrode line is formed on the second surface of the base substrate, where an orthographic projection of the gate line on a plane where the common-electrode line is located at least partially overlaps with the common-electrode line. A conductive structure is formed in the first via hole and at a preset position of the second surface of the base substrate, where the contact pad is connected to a common-electrode line near the first via hole through the conductive structure.

According to the method for manufacturing the array substrate of the disclosure, the gate line is formed on the first surface of the array substrate and the common-electrode line is formed on the second surface of the array substrate opposite to the first surface, and the gate line at least partially overlaps with the common-electrode line, which can reduce a wiring area on the first surface of the array substrate, thereby increasing an area of a pixel-electrode layer in each pixel unit and increasing an aperture ratio of the pixel unit.

Optionally, the stacked structure is formed on the first surface of the base substrate as follows. The contact pad and the gate line are formed on the first surface of the base substrate. A first insulating layer is formed on the contact pad and the gate line. A second insulating layer is formed on the first insulating layer. A second via hole is formed in the first insulating layer and the second insulating layer at positions corresponding to the contact pad. The common-electrode layer is formed on the second insulating layer and in the second via hole, where the common-electrode layer is connected with the contact pad through the second via hole.

Optionally, the second insulating layer is formed on the first insulating layer as follows. A drain-source layer and an active layer are formed on the first insulating layer, where the stacked structure further includes the drain-source layer and the active layer, and the drain-source layer includes a source and a drain. The second insulating layer is formed on the drain-source layer and the active layer.

Optionally, the stacked structure is formed on the first surface of the base substrate as follows. The common-electrode layer and the contact pad are formed on the first surface of the base substrate. A first insulating layer is formed on the common-electrode layer and the contact pad. The gate line is formed on the first insulating layer. A second insulating layer is formed on the gate line.

Optionally, the common-electrode line is formed on the second surface of the base substrate as follows. The common-electrode line corresponding to the gate line is formed on the second surface of the base substrate, where the orthographic projection of the gate line on the plane where the common-electrode line is located completely covers the common-electrode line, or an orthographic projection of the common-electrode line on a plane where the gate line is located completely covers the gate line.

The disclosure further provides a display panel. The display panel includes a color-film substrate and the above array substrate. The array substrate is opposite to the color-film substrate.

The disclosure further provides a display device. The display device includes the above display panel.

Additional aspects and advantages of the disclosure will be illustrated in part from the following description, and the other part of the additional aspects and the advantages of the disclosure will become apparent from the following description, or may be learned by practice of the disclosure.

Referring to FIG. 1, FIG. 1 is a schematic top view of an existing array substrate 100". The array substrate 100" includes multiple gate lines 121" (i.e., scan lines) extending along a first direction (an OX direction illustrated in figures), multiple common-electrode lines 201" extending along the first direction, and multiple source lines 131" (i.e., data lines) extending along a second direction (an OY direction illustrated in figures). The multiple gate lines 121" intersect the multiple source lines 131", to define multiple pixel units 300" arranged in an array. Each pixel unit 300" includes a Thin Film Transistor (TFT) 50", a pixel-electrode layer 30", and a common-electrode layer (not illustrated). A source 52" of the TFT 50" is connected with a source line 131" near the source 52", a drain 53" of the TFT 50" is connected with the pixel-electrode layer 30", and a gate 51" of the TFT 50" is connected with a gate line 121" near the gate 51". The common-electrode layer is connected with a common-electrode line 201" nearby. Since the gate lines 121", the source lines 131", and the common-electrode lines 201" of the existing array substrate 100" each occupy part of a wiring area and each are made of metal and opaque, an area of the pixel-electrode layer 30" in each pixel unit 300" is relatively small, which leads to a low aperture ratio of the pixel unit 300" of the array substrate in 100".

Figure 2:
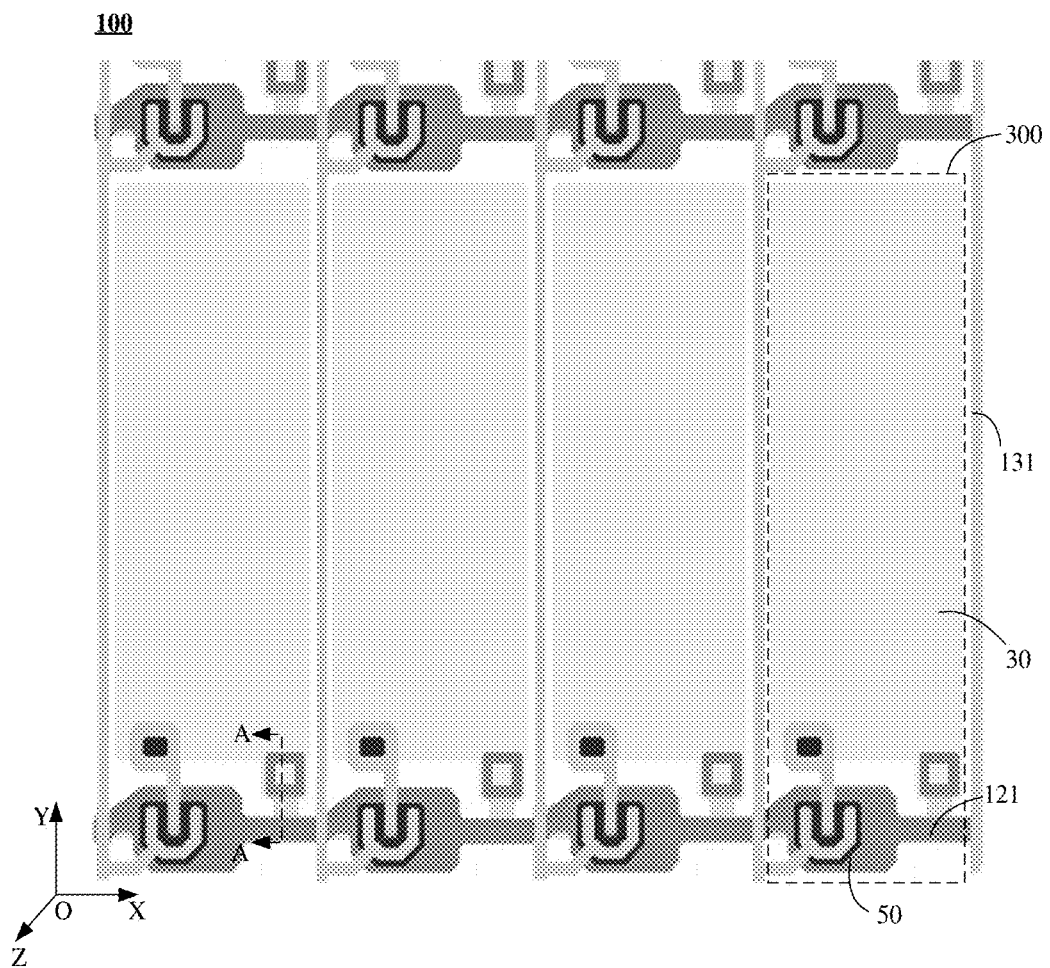
FIG. 2 is a schematic top view of an array substrate provided in implementations of the disclosure.
Figure 3:
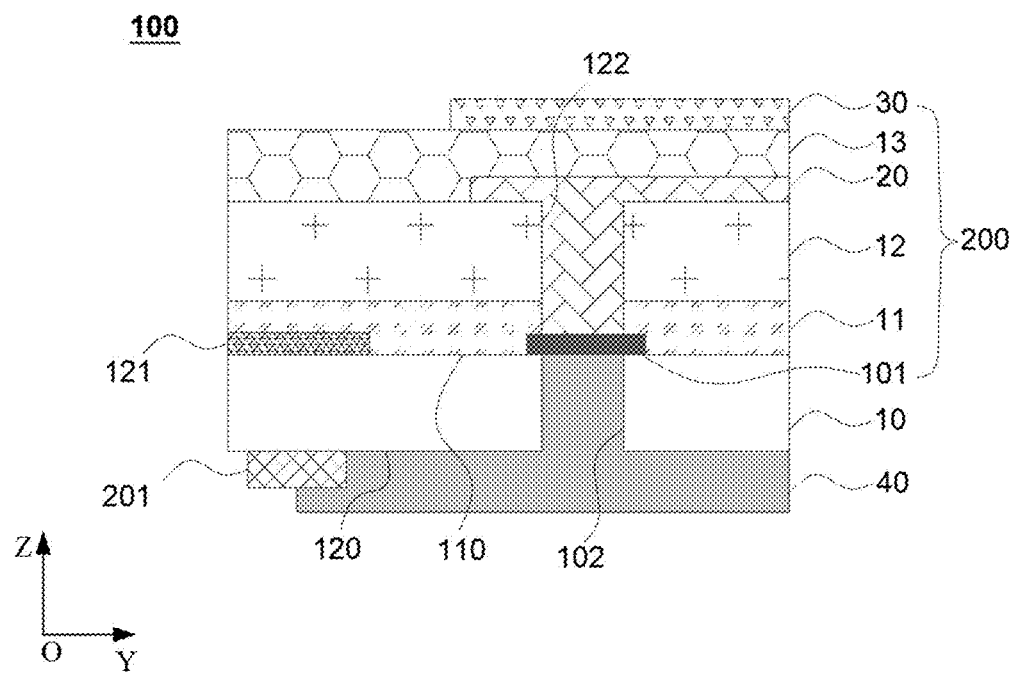
FIG. 3 is a schematic cross-sectional structure diagram of the structure illustrated in FIG. 2 along line A-A.
Figure 4:
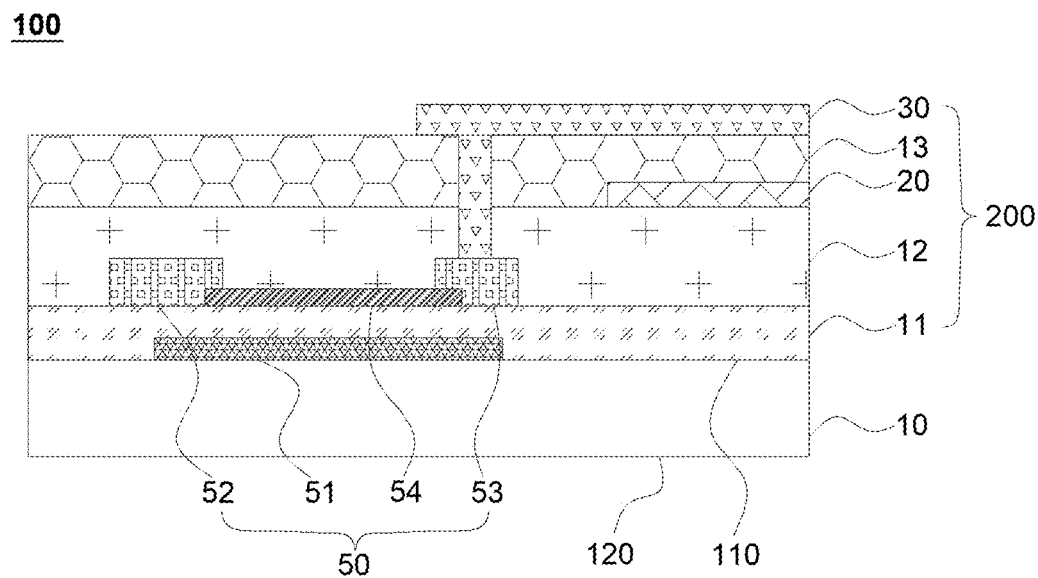
FIG. 4 is a schematic cross-sectional structure diagram of the array substrate illustrated in FIG. 2.

In order to solve the problem of the low aperture ratio of the pixel unit in the existing array substrate, the disclosure provides an array substrate 100, referring to FIG. 2 to FIG. 4. According to the array substrate 100 of the disclosure, a common-electrode line 201 and a gate line 121 are respectively disposed on two opposite surfaces of the array substrate 100, and a projection of the gate line 121 on a plane where the common-electrode line is located at least partially overlaps with the common-electrode line, which can reduce a wiring area in the array substrate 100, thereby increasing an area of a pixel-electrode layer 30 in each pixel unit 300 and increasing an aperture ratio of the pixel unit 300.

Specifically, referring to FIG. 3, the array substrate 100 includes a base substrate 10, a stacked structure 200, a common-electrode line 201, and a conductive structure 40. The base substrate 10 has a first surface 110 and a second surface 120 opposite to the first surface 110.

The stacked structure 200 is disposed on the first surface 110 of the base substrate 10. The stacked structure 200 includes a contact pad 101, a common-electrode layer 20, and a gate line 121. The contact pad 101 is disposed on the first surface 110 of the base substrate 10 and connected with the common-electrode layer 20. The gate line 121 is isolated from the common-electrode layer 20 and the contact pad 101. The base substrate 10 defines a first via hole 102 at a position corresponding to the contact pad 101, and the first via hole 102 penetrates the first surface 110 and the second surface 120 of the base substrate 10. The conductive structure 40 is connected with the contact pad 101 and connected with the common-electrode line 201 through the first via hole 102. The first via hole 102 may be a circular hole or a square hole, or be in other shapes, which is not limited herein.

The common-electrode line 201 is disposed on the second surface 120 of the base substrate 10. An orthographic projection of the gate line 121 on a plane where the common-electrode line 201 is located at least partially overlaps with the common-electrode line 201. In implementations of the disclosure, the orthographic projection of the gate line 121 on the plane where the common-electrode line 201 is located completely covers the common-electrode line 201. Specifically, the gate line 121 includes multiple gate lines 121 extending along the first direction, the common-electrode line 201 includes multiple common-electrode lines 201 extending along the first direction, and the multiple gate lines 121 are in one-to-one correspondence with the multiple common-electrode lines 201. It can be understood that, when an overlapping area of the gate lines 121 and the common-electrode lines 201 is larger, a larger wiring area on the first surface of the array substrate 100 can be reduced, which facilitates increasing the aperture ratio of the pixel unit 300. Exemplarily, for each of the gate lines 121, a projection of the gate line 121 on the plane where a corresponding common-electrode line 201 is located completely overlaps with the common-electrode line 201. Since a wiring area of the common-electrode lines 201 in the existing array substrate occupies about 10% of a pixel area, by adopting the array substrate 100 of the disclosure, the wiring area on the first surface 110 can be reduced by 10% and the area of the pixel-electrode layer 30 in each pixel unit 300 can be increased by 10%, therefore, the aperture ratio of the pixel unit 300 can be increased by about 10%.

It should be noted that, in implementations of the disclosure, each pixel unit 300 includes a contact pad 101 and a common-electrode layer 20, the base substrate 10 defines a first via hole 102 at a position corresponding to each contact pad 101, and contact pads 101 are connected with common-electrode layers 20 in one-to-one correspondence.

Exemplarily, the base substrate 10 may be a hard substrate made of a light-guiding and non-metallic material with certain firmness, such as glass, quartz, common resin, etc., or the base substrate 10 may also be a flexible substrate made of a flexible material such as Polyimide (PI). The common-electrode layer 20 may be made of a metal oxide such as Indium Tin Oxide (ITO), Indium Zinc Oxide (IZO), etc. The conductive structure 40 may be formed through a silver paste printing process. The common-electrode line 201, the gate line 121, and the contact pad 101 may be made of same or different materials, exemplarily, a conductive metal, for example, at least one of molybdenum, aluminum, chromium, tungsten, tantalum, titanium, or copper.

According to the array substrate 100 of the disclosure, the gate line 121 is disposed on the first surface 110 of the array substrate 100 and the common-electrode line 201 is disposed on the second surface 120 of the array substrate 100 opposite to the first surface 110, and the gate line 121 at least partially overlaps with the common-electrode line 201, which can reduce the wiring area on the first surface 110 of the array substrate 100, thereby increasing the area of the pixel-electrode layer 30 in each pixel unit 300 and increasing the aperture ratio of the pixel unit 300.

It should be noted that, the number of layered structures in the stacked structure 200 and positional relationships between the layered structures can be designed according to requirements, which are not limited in the disclosure.

Exemplarily, in an implementation, as illustrated in FIG. 3 and FIG. 4, the gate line 121 and the contact pad 101 of the stacked structure 200 are disposed in a same layer, and are disposed on the first surface 110 of the base substrate 10. The stacked structure 200 further includes a first insulating layer 11, a source-drain layer, an active layer 54, a second insulating layer 12, a third insulating layer 13, and a pixel-electrode layer 30.

Specifically, the gate line 121 and a gate 51 are disposed in a same layer. The first insulating layer 11 covers the gate line 121, the gate 51, and the contact pad 101. The source-drain layer and the active layer 54 are disposed on the first insulating layer 11. The source-drain layer includes a source 52 and a drain 53. A gate 51, a source 52, a drain 53, and an active layer 54 in a same pixel unit 300 together form a TFT 50. The second insulating layer 12 covers the source-drain layer and the active layer 54. The common-electrode layer 20 is disposed on the second insulating layer 12. The third insulating layer 13 covers the common-electrode layer 20. The pixel-electrode layer 30 is disposed on the third insulating layer 13. Exemplarily, an orthographic projection of the pixel-electrode layer 30 on the base substrate 10 overlaps with an orthographic projection of the common-electrode layer 20 on the base substrate 10.

Further, the first insulating layer 11 and the second insulating layer 12 define a second via hole 122 at positions corresponding to the contact pad 101. The common-electrode layer 20 is connected with the contact pad 101 through the second via hole 122. Specifically, in implementations of the disclosure, a first insulating layer 11 and a second insulating layer 12 in each pixel unit 300 define a second via hole 122, and common-electrode layers 20 are connected with contact pads 101 in one-to-one correspondence through a corresponding second via hole 122.

Figure 5:
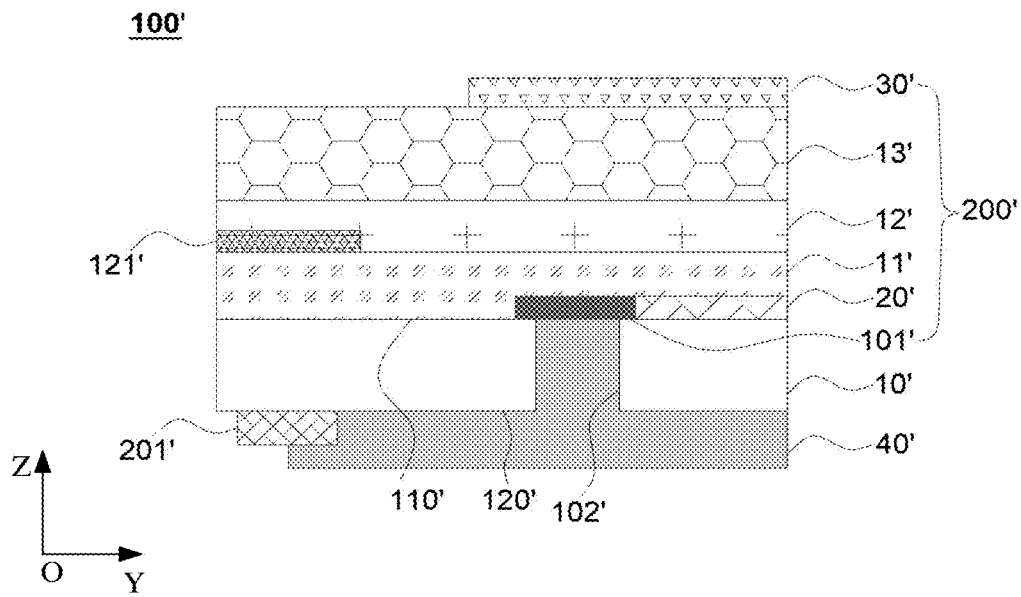
FIG. 5 is a schematic cross-sectional structure diagram of the structure illustrated in FIG. 2 along line A-A.
Figure 6:
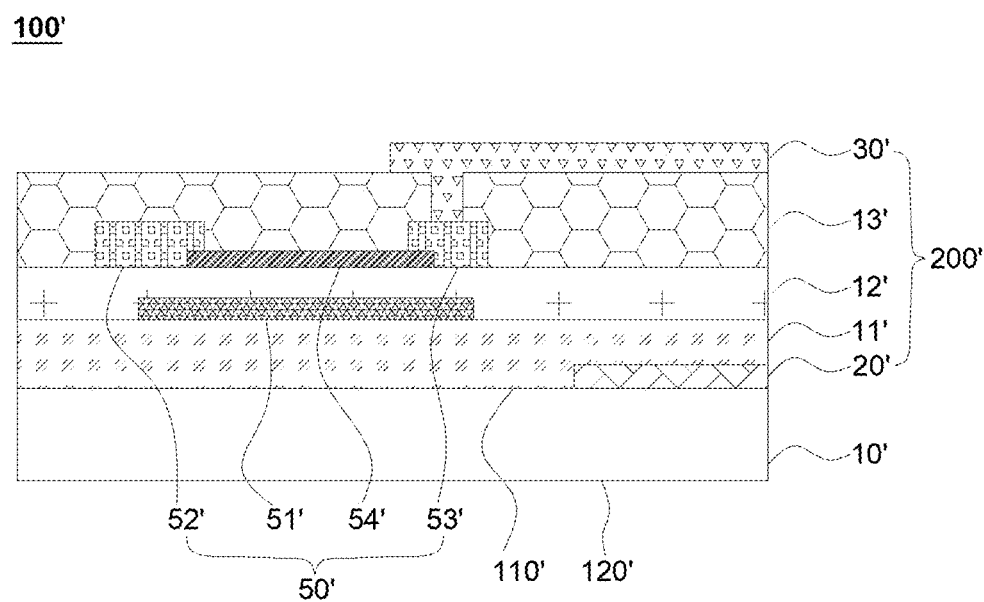
FIG. 6 is a schematic cross-sectional structure diagram of the array substrate illustrated in FIG. 2.

In another implementation, as illustrated in FIG. 5 and FIG. 6, a common-electrode layer 20' and a contact pad 101' are disposed in a same layer and connected with each other, and are disposed on a first surface 110' of a base substrate 10'. The stacked structure 200' further includes a first insulating layer 11', a second insulating layer 12', a source-drain layer, an active layer 54', a third insulating layer 13', and a pixel-electrode layer 30'.

Specifically, the first insulating layer 11' covers the contact pad 101' and the common-electrode layer 20'. A gate line 121' and a gate 51' are disposed in a same layer, and are disposed on the first insulating layer 11'. The second insulating layer 12' covers the gate line 121' and the gate 51'. The source-drain layer is disposed on the second insulating layer 12'. The source-drain layer includes a source 52' and a drain 53'. A gate 51', a source 52', a drain 53', and an active layer 54' in a same pixel unit 300 jointly constitute a TFT 50'. The third insulating layer 13' covers the source-drain layer. The pixel-electrode layer 30' is disposed on the third insulating layer 13'.

Figure 7:
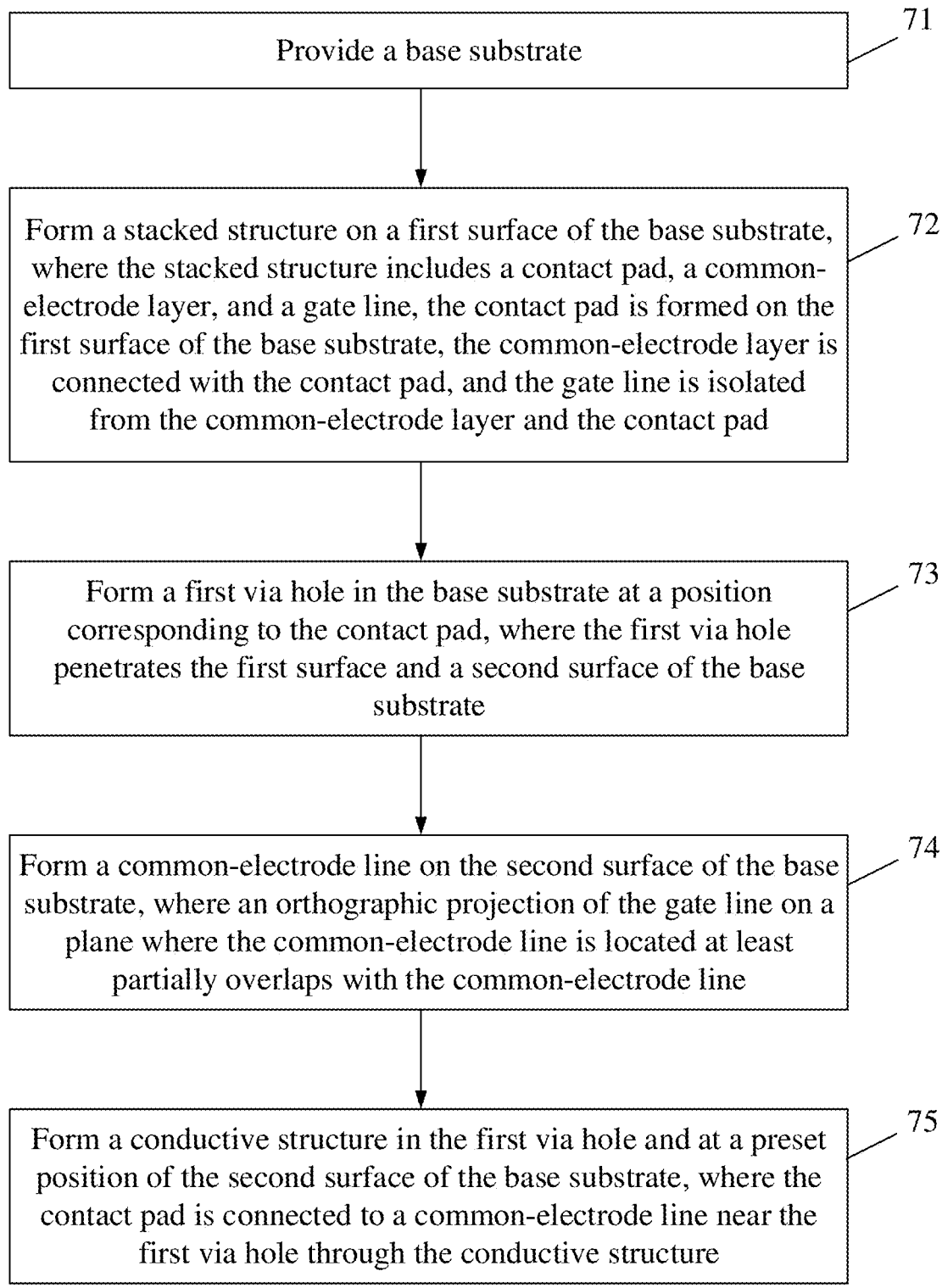
FIG. 7 is a schematic flowchart illustrating a method for manufacturing an array substrate provided in implementations of the disclosure.

Based on the same inventive concept, implementations of the disclosure further provide a method for manufacturing an array substrate. As illustrated in FIG. 7, the method includes the following.

At 71, a base substrate 10 is provided. The base substrate 10 has a first surface 110 and a second surface 120 opposite to the first surface 110. Exemplarily, the base substrate 10 may be a hard substrate made of a light-guiding and non-metallic material with certain firmness, such as glass, quartz, common resin, etc., or the base substrate 10 may also be a flexible substrate made of a flexible material such as PI.

At 72, a stacked structure 200 is formed on the first surface 110 of the base substrate 10. The stacked structure 200 includes a contact pad 101, a common-electrode layer 20, and a gate line 121, where the contact pad 101 is formed on the first surface 110 of the base substrate 10, the common-electrode layer 20 is connected with the contact pad 101, and the gate line 121 is isolated from the common-electrode layer 20 and the contact pad 101.

At 73, a first via hole 102 is formed in the base substrate 10 at a position corresponding to the contact pad 101, where the first via hole 102 penetrates the first surface 110 and second surface 120 of the base substrate 10, and the contact pad 101 is exposed to outside of the first via hole 102.

It should be noted that, the first via hole 102 may be a circular hole or a square hole, or be in other shapes, which is not limited herein. Since an area of a single pixel unit 300 is relatively small, the size of the first via hole 102 needs to be controlled within a certain range. Exemplarily, the first via hole 102 is a circular hole with a diameter of about 10 um, or a square hole with a side length of about 10 um. If the base substrate 10 is made of glass, HF and $O_2$ can be used to etch glass ($SiO_2$), and the first via hole 102 can be formed through a cyclic dry etching process, where the cyclic dry etching process belongs to an existing technology, which will not be repeated herein. Since each pixel unit 300 defines a first via hole 102, the number of first via holes 102 on the base substrate 10 is relatively large and arrangement of the first via holes 102 is relatively dense. If the base substrate 10 is made of glass, the requirement for the cyclic dry etching process is relatively high, otherwise, the base substrate may be broken. In the disclosure, the base substrate 10 may also be made of polyimide, so that the first via hole 102 can be formed through exposure and development, as such, the process is relatively simple, and the base substrate will not be broken. Specifically, a mask with a pattern is covered on the second surface 120 of the base substrate 10. An ultraviolet light selectively irradiates the second surface 120 of the base substrate 10, and then developer is used to remove polyimide of part of the base substrate 10 that was illuminated or polyimide of part of the base substrate 10 that was not illuminated, to make the pattern on the mask be formed on the base substrate 10, that is, the first via hole 102 is formed.

At 74, a common-electrode line 201 is formed on the second surface 120 of the base substrate 10, where an orthographic projection of the gate line 121 on a plane where the common-electrode line 201 is located at least partially overlaps with the common-electrode line 201. In implementations of the disclosure, exemplarily, the common-electrode line 201 can be formed through a patterning process. Specifically, multiple common-electrode lines 201 in one-to-one correspondence with multiple gate lines 121 are formed on the second surface 120 of the base substrate 10 through a patterning process, where orthographic projections of the multiple gate lines 121 on a plane where the common-electrode lines 201 are located completely cover the multiple common-electrode lines 201, or, orthographic projections of the multiple common-electrode lines 201 on a plane where the gate lines 121 are located completely cover the multiple gate lines 121.

The "patterning process" of implementations of the disclosure includes film deposition, photoresist coating, mask exposure, developing, etching, photoresist stripping, and other processes. The deposition may adopt any one or more of sputtering, evaporation, chemical vapor deposition. The coating may be any one or more of spray coating and spin coating. The etching may be any one or more of dry etching and wet etching. Each of the above processes belongs to an existing technology, which will not be repeated herein.

At 75, a conductive structure 40 is formed in the first via hole 102 and at a preset position of the second surface 120 of the base substrate 10, where the contact pad 101 is connected to a common-electrode line 201 near the first via hole 102 through the conductive structure 40. Exemplarily, the conductive structure 40 is formed through a silver paste printing process, where the contact pad 101 in each pixel unit 300 is connected to a nearby common-electrode line 201 through a corresponding first via hole 102.

It should be noted that, the disclosure does not limit an order for executing the operations at 73 to 75, as long as the operations at 75 are after the operations at 73. In another implementation, the operations at 74 are performed first, then the operations at 73, and finally the operations at 75. In yet another implementation, the operations at 73 are performed first, then the operations at 75, and finally the operations at 74.

Figure 8:
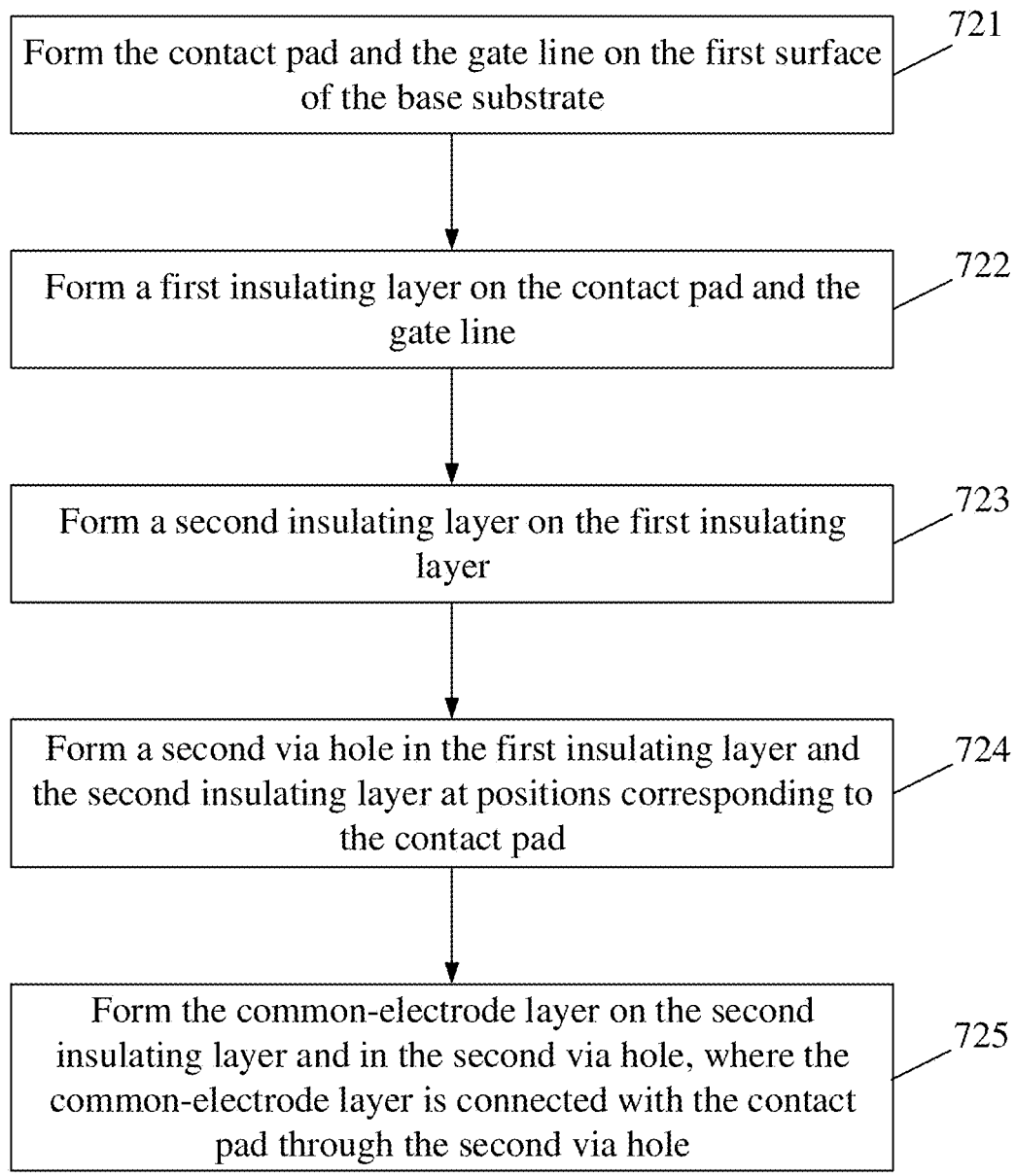
FIG. 8 is a detailed flowchart of operations at 72 illustrated in FIG. 7.

As mentioned above, the number of layered structures in the stacked structure 200 and positional relationships between the layered structures can be designed according to requirements. The operations at 72 correspond to features of the stacked structure 200, which is not limited herein. Exemplarily, in an implementation, as illustrated in FIG. 8, the operations at 72 specifically include the following.

At 721, the contact pad 101 and the gate line 121 are formed on the first surface 110 of the base substrate 10. In this implementation, a gate 51 is also formed on the first surface 110 of the base substrate 10. Exemplarily, the contact pad 101, the gate line 121, and the gate 51 are made of a same material, and can be formed through a patterning process. Specifically, a contact pad 101 is formed in each pixel unit 300.

At 722, a first insulating layer 11 is formed on the contact pad 101 and the gate line 121. In this implementation, the first insulating layer 11 also covers the gate 51. Exemplarily, the first insulating layer 11 is made of a material such as silicon nitride, silicon oxide, or silicon oxynitride.

At 723, a second insulating layer 12 is formed on the first insulating layer 11.

In implementations of the disclosure, the operations at 723 specifically include the following.

At 723a, a source-drain layer and an active layer 54 are formed on the first insulating layer 11. The active layer 54 may be a semiconductor active layer or an oxide active layer. For example, the active layer 54 is a semiconductor active layer made of a semiconductor material such as amorphous silicon or polycrystalline silicon. Exemplarily, the active layer 54 is formed through a patterning process, and the source-drain layer is formed through another patterning process.

At 723b, the second insulating layer 12 is formed on the source-drain layer and the active layer 54. Exemplarily, the second insulating layer 12 is made of a material such as silicon nitride, silicon oxide, or silicon oxynitride.

At 724, a second via hole 122 is formed in the first insulating layer 11 and the second insulating layer 12 at positions corresponding to the contact pad 101, where the contact pad 101 is exposed to outside of the second via hole 122. Specifically, the first insulating layer 11 and the second insulating layer 12 in each pixel unit 300 define a second via hole 122.

At 725, the common-electrode layer 20 is formed on the second insulating layer 12 and in the second via hole, where the common-electrode layer 20 is connected with the contact pad 101 through the second via hole. Specifically, the common-electrode layer 20 in each pixel unit 300 is connected with a corresponding contact pad 101 through the second via hole 122.

According to the method for manufacturing the array substrate of the disclosure, the gate line 121 is formed on the first surface 110 of the array substrate 100 and the common-electrode line 201 is formed on the second surface 120 of the array substrate 100 opposite to the first surface 110, and the gate line 121 at least partially overlaps with the common-electrode line 201, which can reduce a wiring area on the first surface 110 of the array substrate 100, thereby increasing an area of the pixel-electrode layer 30 in each pixel unit 300 and increasing an aperture ratio of the pixel unit 300.

Figure 9:
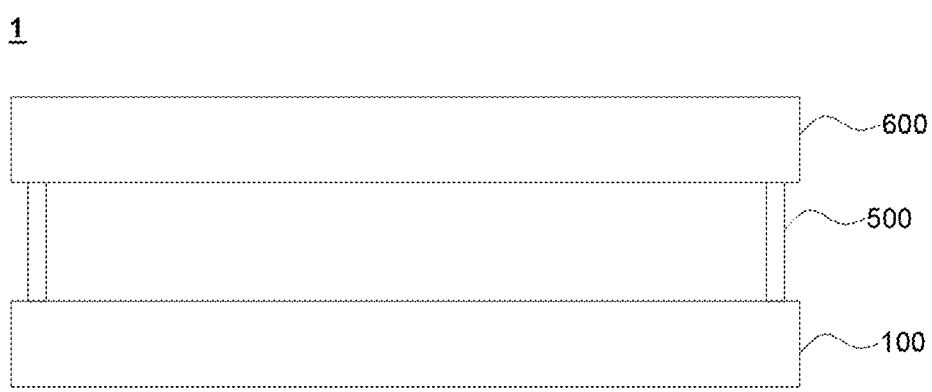
FIG. 9 is a schematic structural diagram illustrating a display panel provided in implementations of the disclosure.

Based on the same inventive concept, referring to FIG. 9, the disclosure further provides a display panel 1. The display panel 1 includes a color-film substrate 600, the above array substrate 100, and a sealant 500. The array substrate 100 is disposed opposite to the color-film substrate 600. The display panel 1 further includes a liquid crystal layer (not illustrated) filled between the color-film substrate 600 and the array substrate 100. The sealant 500 is disposed around the liquid crystal layer, and configured to seal the liquid crystal layer between the array substrate 100 and the color-film substrate 600. The display panel 1 may further include other structures, for example, a lower polarizer (not illustrated), an upper polarizer (not illustrated), etc., which is not limited herein.

Exemplarily, the display panel 1 may be a TFT-LCD with various liquid crystal driving and display modes, including but not limited to, a Twisted Nematic (TN) panel, a Vertical Alignment (VA) panel, an In-Plane Switching (IPS) panel, etc.

Based on the same inventive concept, the disclosure further provides a display device (not illustrated). The display device includes the above display panel 1.

While the implementations of the disclosure have been illustrated and depicted above, it will be understood by those of ordinary skill in the art that various changes, modifications, substitutions, and alterations can be made to these implementations without departing from the principles and spirits of the disclosure. Therefore, the scope of the disclosure is defined by the appended claims and equivalents of the appended claims.

What is claimed is:

1. An array substrate, comprising:
   a base substrate having a first surface and a second surface opposite to the first surface;
   a stacked structure disposed on the first surface of the substrate, the stacked structure comprising:
   a contact pad disposed on the first surface of the base substrate, wherein the base substrate defines a first via hole at a position corresponding to the contact pad, the first via hole penetrating the first surface and the second surface of the base substrate;
   a common-electrode layer connected with the contact pad; and
   a gate line isolated from the common-electrode layer and the contact pad;
   a common-electrode line disposed on the second surface of the base substrate, wherein an orthographic projection of the gate line on a plane where the common-electrode line is located at least partially overlaps with the common-electrode line; and a conductive structure connected with the contact pad, and connected to the common-electrode line through the first via hole.

2. The array substrate of claim 1, wherein
the gate line and the contact pad of the stacked structure are disposed in a same layer, and are disposed on the first surface of the base substrate; and
the stacked structure further comprises:
a first insulating layer covering the gate line and the contact pad; and
a second insulating layer disposed on the first insulating layer, wherein
the common-electrode layer is disposed on the second insulating layer; the first insulating layer and the second insulating layer define a second via hole at positions corresponding to the contact pad, and the common-electrode layer is connected with the contact pad through the second via hole.

3. The array substrate of claim 1, wherein
the stacked structure further comprises a first insulating layer, a second insulating layer, a third insulating layer, a gate, a source, a drain, an active layer, and a pixel-electrode layer;
the gate line, the contact pad, and the gate are disposed on the first surface of the base substrate;
the first insulating layer covers the gate line, the contact pad, and the gate;
the source, the drain, and the active layer are disposed on the first insulating layer;
the second insulating layer covers the source, the drain, and the active layer;
the common-electrode layer is disposed on the second insulating layer, wherein the first insulating layer and the second insulating layer define a second via hole at positions corresponding to the contact pad, and the common-electrode layer is connected with the contact pad through the second via hole;
the third insulating layer covers the common-electrode layer; and
the pixel-electrode layer is disposed on the third insulating layer.

4. The array substrate of claim 3, wherein an orthographic projection of the pixel-electrode layer on the base substrate overlaps with an orthographic projection of the common-electrode layer on the base substrate.

5. The array substrate of claim 1, wherein
the common-electrode layer and the contact pad of the stacked structure are disposed in a same layer, and are disposed on the first surface of the base substrate; and
the stacked structure further comprises a first insulating layer, wherein the first insulating layer covers the common-electrode layer and the contact pad, and the gate line is disposed on the first insulating layer.

6. The array substrate of claim 1, wherein
the stacked structure further comprises a first insulating layer, a second insulating layer, a third insulating layer, a gate, a source, a drain, an active layer, and a pixel-electrode layer;
the common-electrode layer and the contact pad are disposed on the first surface of the base substrate;
the first insulating layer covers the common-electrode layer and the contact pad;
the gate line and the gate are disposed on the first insulating layer;
the second insulating layer covers the gate line and the gate;

the source, the drain, and the active layer are disposed on the second insulating layer;
the third insulating layer covers the source, the drain, and the active layer; and
the pixel-electrode layer is disposed on the third insulating layer.

7. The array substrate of claim 1, wherein the orthographic projection of the gate line on the plane where the common-electrode line is located completely covers the common-electrode line, or an orthographic projection of the common-electrode line on a plane where the gate line is located completely covers the gate line.

8. The array substrate of claim 1, wherein the base substrate is made of glass or polyimide.

9. A method for manufacturing an array substrate, comprising:
providing a base substrate, wherein the base substrate has a first surface and a second surface opposite to the first surface;
forming a stacked structure on the first surface of the base substrate, wherein the stacked structure comprises a contact pad, a common-electrode layer, and a gate line, the contact pad is formed on the first surface of the base substrate, the common-electrode layer is connected with the contact pad, and the gate line is isolated from the common-electrode layer and the contact pad;
forming a first via hole in the base substrate at a position corresponding to the contact pad, wherein the first via hole penetrates the first surface and the second surface of the base substrate;
forming a common-electrode line on the second surface of the base substrate, wherein an orthographic projection of the gate line on a plane where the common-electrode line is located at least partially overlaps with the common-electrode line; and
forming a conductive structure in the first via hole and at a preset position of the second surface of the base substrate, wherein the contact pad is connected to a common-electrode line near the first via hole through the conductive structure.

10. The method of claim 9, wherein forming the stacked structure on the first surface of the base substrate comprises:
forming the contact pad and the gate line on the first surface of the base substrate;
forming a first insulating layer on the contact pad and the gate line;
forming a second insulating layer on the first insulating layer;
forming a second via hole in the first insulating layer and the second insulating layer at positions corresponding to the contact pad; and
forming the common-electrode layer on the second insulating layer and in the second via hole, wherein the common-electrode layer is connected with the contact pad through the second via hole.

11. The method of claim 10, wherein forming the second insulating layer on the first insulating layer comprises:
forming a drain-source layer and an active layer on the first insulating layer, wherein the stacked structure further comprises the drain-source layer and the active layer, and the drain-source layer comprises a source and a drain; and
forming the second insulating layer on the drain-source layer and the active layer.

12. The method of claim 9, wherein forming the stacked structure on the first surface of the base substrate comprises:

forming the common-electrode layer and the contact pad on the first surface of the base substrate;

forming a first insulating layer on the common-electrode layer and the contact pad;

forming the gate line on the first insulating layer; and forming a second insulating layer on the gate line.

13. The method of claim 10, wherein forming the common-electrode line on the second surface of the base substrate comprises:

forming on the second surface of the base substrate the common-electrode line corresponding to the gate line, wherein the orthographic projection of the gate line on the plane where the common-electrode line is located completely covers the common-electrode line, or an orthographic projection of the common-electrode line on a plane where the gate line is located completely covers the gate line.

14. A display panel, comprising:

a color-film substrate; and an array substrate opposite to the color-film substrate, wherein the array substrate comprises:

a base substrate having a first surface and a second surface opposite to the first surface;

a stacked structure disposed on the first surface of the substrate, the stacked structure comprising:

a contact pad disposed on the first surface of the base substrate, wherein the base substrate defines a first via hole at a position corresponding to the contact pad, the first via hole penetrating the first surface and the second surface of the base substrate;

a common-electrode layer connected with the contact pad; and a gate line isolated from the common-electrode layer and the contact pad;

a common-electrode line disposed on the second surface of the base substrate, wherein an orthographic projection of the gate line on a plane where the common-electrode line is located at least partially overlaps with the common-electrode line; and a conductive structure connected with the contact pad, and connected to the common-electrode line through the first via hole.

15. The display panel of claim 14, wherein the gate line and the contact pad of the stacked structure are disposed in a same layer, and are disposed on the first surface of the base substrate; and the stacked structure further comprises:

a first insulating layer covering the gate line and the contact pad; and a second insulating layer disposed on the first insulating layer, wherein the common-electrode layer is disposed on the second insulating layer; the first insulating layer and the second insulating layer define a second via hole at positions corresponding to the contact pad, and the common-electrode layer is connected with the contact pad through the second via hole.

16. The display panel of claim 14, wherein the stacked structure further comprises a first insulating layer, a second insulating layer, a third insulating layer, a gate, a source, a drain, an active layer, and a pixel-electrode layer;

the gate line, the contact pad, and the gate are disposed on the first surface of the base substrate;

the first insulating layer covers the gate line, the contact pad, and the gate;

the source, the drain, and the active layer are disposed on the first insulating layer;

the second insulating layer covers the source, the drain, and the active layer;

the common-electrode layer is disposed on the second insulating layer, wherein the first insulating layer and the second insulating layer define a second via hole at positions corresponding to the contact pad, and the common-electrode layer is connected with the contact pad through the second via hole;

the third insulating layer covers the common-electrode layer; and the pixel-electrode layer is disposed on the third insulating layer.

17. The display panel of claim 16, wherein an orthographic projection of the pixel-electrode layer on the base substrate overlaps with an orthographic projection of the common-electrode layer on the base substrate.

18. The display panel of claim 14, wherein the common-electrode layer and the contact pad of the stacked structure are disposed in a same layer, and are disposed on the first surface of the base substrate; and the stacked structure further comprises a first insulating layer, wherein the first insulating layer covers the common-electrode layer and the contact pad, and the gate line is disposed on the first insulating layer.

19. The display panel of claim 14, wherein the stacked structure further comprises a first insulating layer, a second insulating layer, a third insulating layer, a gate, a source, a drain, an active layer, and a pixel-electrode layer;

the common-electrode layer and the contact pad are disposed on the first surface of the base substrate;

the first insulating layer covers the common-electrode layer and the contact pad;

the gate line and the gate are disposed on the first insulating layer;

the second insulating layer covers the gate line and the gate;

the source, the drain, and the active layer are disposed on the second insulating layer;

the third insulating layer covers the source, the drain, and the active layer; and the pixel-electrode layer is disposed on the third insulating layer.

20. The display panel of claim 14, wherein the orthographic projection of the gate line on the plane where the common-electrode line is located completely covers the common-electrode line, or an orthographic projection of the common-electrode line on a plane where the gate line is located completely covers the gate line.

* * * * *